United States Patent [19]

McClure

[11] Patent Number: 5,396,108
[45] Date of Patent: Mar. 7, 1995

[54] LATCH CONTROLLED OUTPUT DRIVER

[75] Inventor: David C. McClure, Carrollton, Tex.

[73] Assignee: SGS-Thomson Microelectronics, Inc., Carrollton, Tex.

[21] Appl. No.: 129,257

[22] Filed: Sep. 30, 1993

[51] Int. Cl.$^6$ .................. H03K 17/296; H03K 17/795
[52] U.S. Cl. .................... 327/108; 327/208; 327/215; 327/526
[58] Field of Search ............ 307/29, 219, 247.1, 307/279, 291, 412, 445, 573, 592

Primary Examiner—William L. Sikes
Assistant Examiner—Fetsum Abraham
Attorney, Agent, or Firm—Kenneth C. Hill; Lisa K. Jorgenson; Richard K. Robinson

[57] ABSTRACT

A latch output driver including an output driver circuit having a pull-up transistor and a pull-down transistor connected in series, wherein the pull-up transistor has a drain connected to an upper power supply voltage and a source connected to a drain of the pull-down transistor and the pull-down transistor has a source connected to a lower power supply voltage. The latch controlled output driver also includes a first latch circuit having an output connected to the gate of the pull-up transistor and a second latch circuit having an output connected to the gate of the pull-down transistor. A control circuit is connected to the first and second latches, wherein the control circuit may selectively disable and enable the latch controlled output driver in response to a control signal. A driver output is connected between the pull-up and pull-down transistors, wherein the output driver is in an open state when the latch controlled output driver is disabled by the control circuit. A data circuit is connected to the first and second latch circuits, wherein the data circuit stores the state of the first and second latches present when the latch controlled output driver is enabled and restores the state of the first and second latches when the latch controlled output driver is enabled after being disabled.

26 Claims, 3 Drawing Sheets

LATCH CONTROLLED OUTPUT DRIVER

BACKGROUND OF THE INVENTION

1. Field of the Invention

The present invention relates to the field of microelectronics and in particular to digital circuits. Still more particularly, the present invention relates to output drivers in digital circuits.

2. Description of the Prior Art

In a digital circuit system, a common path is often used to share and transfer data between various circuits and devices in the system. A small set of shared lines, a bus, may be used to provide the common path. In the designing of digital circuit systems, some devices may have an insufficient amount of maximum output current to drive all of the lines connected to the devices. As a result, a current amplifier, called a driver or a buffer, is used to provide the needed currents.

Latches are often used to control output drivers in digital circuit systems. In some instances it is desirable to enable and disable the output driver. For example, the output driver may be disabled (placed into an open state) so that another logic device may drive the same line that the output driver is connected to. Previously, latches were enabled and disabled using a logic gate placed between the latch and the output driver as shown in FIG. 1.

Referring to FIG. 1, a schematic diagram of a latch controlled output driver 70 known in the prior art is depicted. Latch controlled output driver circuit 70 includes an input circuit 71, a latch circuit 72, an enable/disable circuit 74, and an output driver circuit 76. Input circuit 71 is constructed from pass gates G1 and G2 and inverter I1; latch circuit 72 is constructed from inverters I2–I5. Enable/disable circuit 74 is constructed from NAND gates A1 and A2 and inverters I6 and I7, and output driver circuit 76 includes transistors T1 and T2. Transistor T1 is a pull-up transistor and transistor T2 is a pull-down transistor in the output driver portion of this circuit. Transistors T1 and T2 are n-channel metal-oxide field effect transistors (MOSFETs). The drain of transistor T1 is connected to power supply voltage VCC, and the source of transistor T2 is connected to power supply voltage VSS. Typically, power supply voltage VCC is at a higher voltage than power supply voltage VSS.

Signals are input into latch controlled output driver circuit 70 at inputs GDT and GDC. The gate of transistor T1 is controlled by a signal entering the latch controlled output driver at input GDT; the gate of transistor T2 is controlled by a signal entering the latch controlled output driver 70 at input GDC. Pass gates G1 and G2 control the flow of the signal from inputs GDT and GDC to output driver circuit 76. Pass gates G1 and G2 are controlled by a clock signal, CLK applied to point 80 and a complement clock signal, /CLK, which is generated by passing the clock signal through inverter I1.

Referring back to latch circuit 72, inverters I2 and I3 are cross-coupled; inverters I4 and I5 are cross-coupled. When pass gates G1 and G2 are turned off, inverters I2–I5 provide the latching mechanism to provide a continuous signal to the gates of transistor T1 and T2 when output driver circuit 76 is enabled by enable/disable circuit 74.

NAND gates A1 and A2 in enable/disable circuit 74 are employed to enable and disable output driver circuit 76. Signals from input points GDT and GDC are allowed to travel through NAND gates A1 and A2 to the gates of transistors T1 and T2 when the signal at inputs OE are a logic one. In the situation, where the signal at inputs OE is a logic zero, the latch controlled output circuit 70 is disabled, both transistors are off, and the output of output driver circuit 76 is a high Z.

The addition of the NAND gates and inverters to provide an enable/disable function in latch controlled output driver 70 in FIG. 1 increases the response time of the latch controlled output driver. Therefore, it would be desirable to have an apparatus to decrease the time needed to enable and disable a latch controlled output driver.

SUMMARY OF THE INVENTION

The present invention provides a latch controlled output driver that contains an output driver circuit including a pull-up transistor and a pull-down transistor connected in series. An output is located at a node between the two transistors. The gate of each transistor has a latch connected to it to latch data. A control circuit is connected to the inputs of the latches and connects the data inputs to the latches in an enabled state. When the control circuit places the latch controlled output driver in a disabled state, the latches are forced to a value which turns off both output transistors. Data is stored in a data circuit before the latches are driven to disable the latch controlled output driver. The data is restored to the latches from the data circuit when the latch controlled output driver circuit returns to an enabled state.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
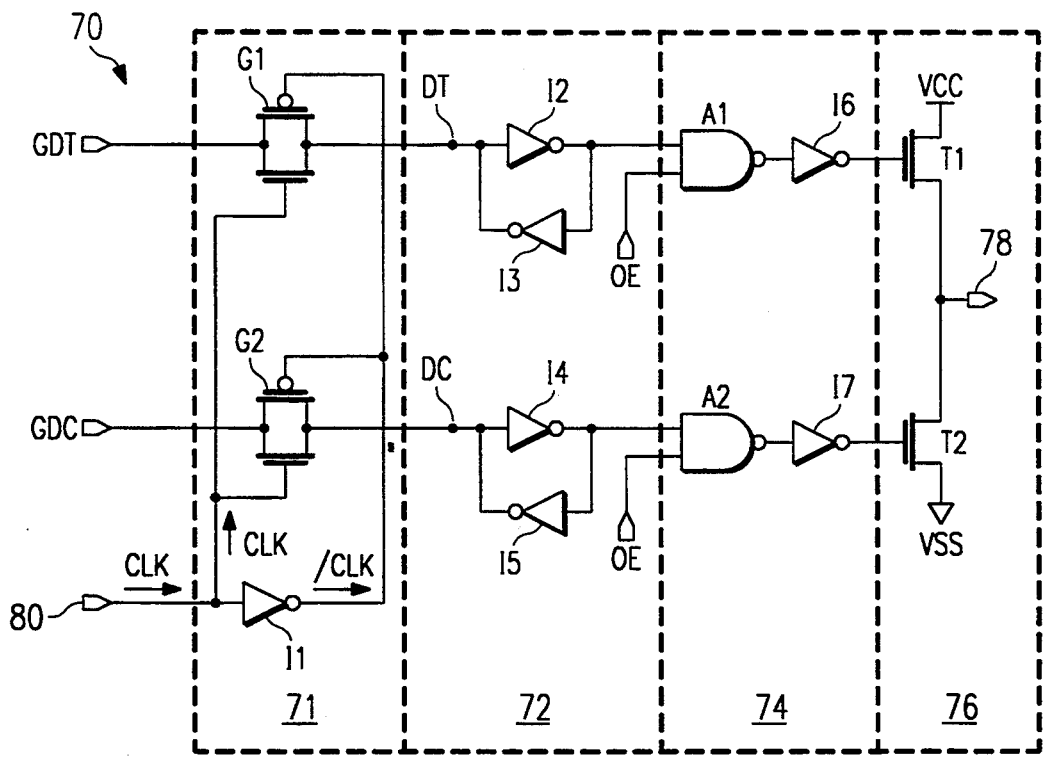
FIG. 1 a schematic diagram of a latch controlled output driver known in the prior art.
Figure 2:
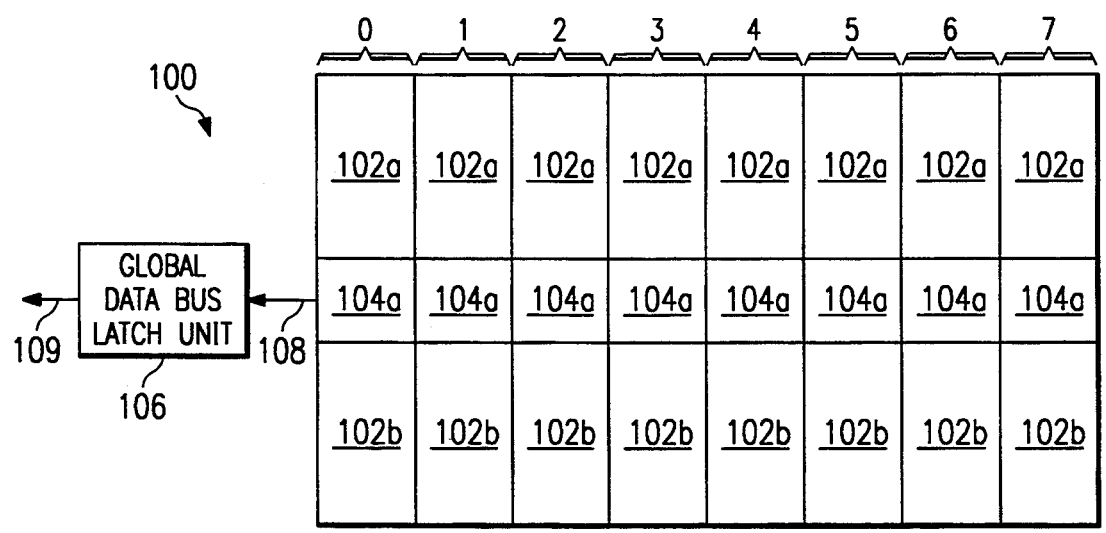
FIG. 2 a block diagram of a memory array is illustrated in which a preferred embodiment of the present invention may be implemented.

With reference not to the figures and in particular with reference to FIG. 2, a block diagram of a memory array 100 is illustrated in which a preferred embodiment of the present invention may be implemented. Memory array 100 (also just called a "memory") is subdivided into eight memory groups: 0–7. Each memory group contains a memory block 102a, a memory block 102b, and an input/output (I/O) block 104a. I/O block 104a is interposed between the two memory blocks 102a and 102b. Data bus latch block 106 is connected to the I/O blocks 104a of memory groups 0–7 via a data bus 108.

Data bus latch block 106 also has an output bus 109. Data bus latch block 106 includes latch controlled output drivers, as will now be described.

Figure 3:
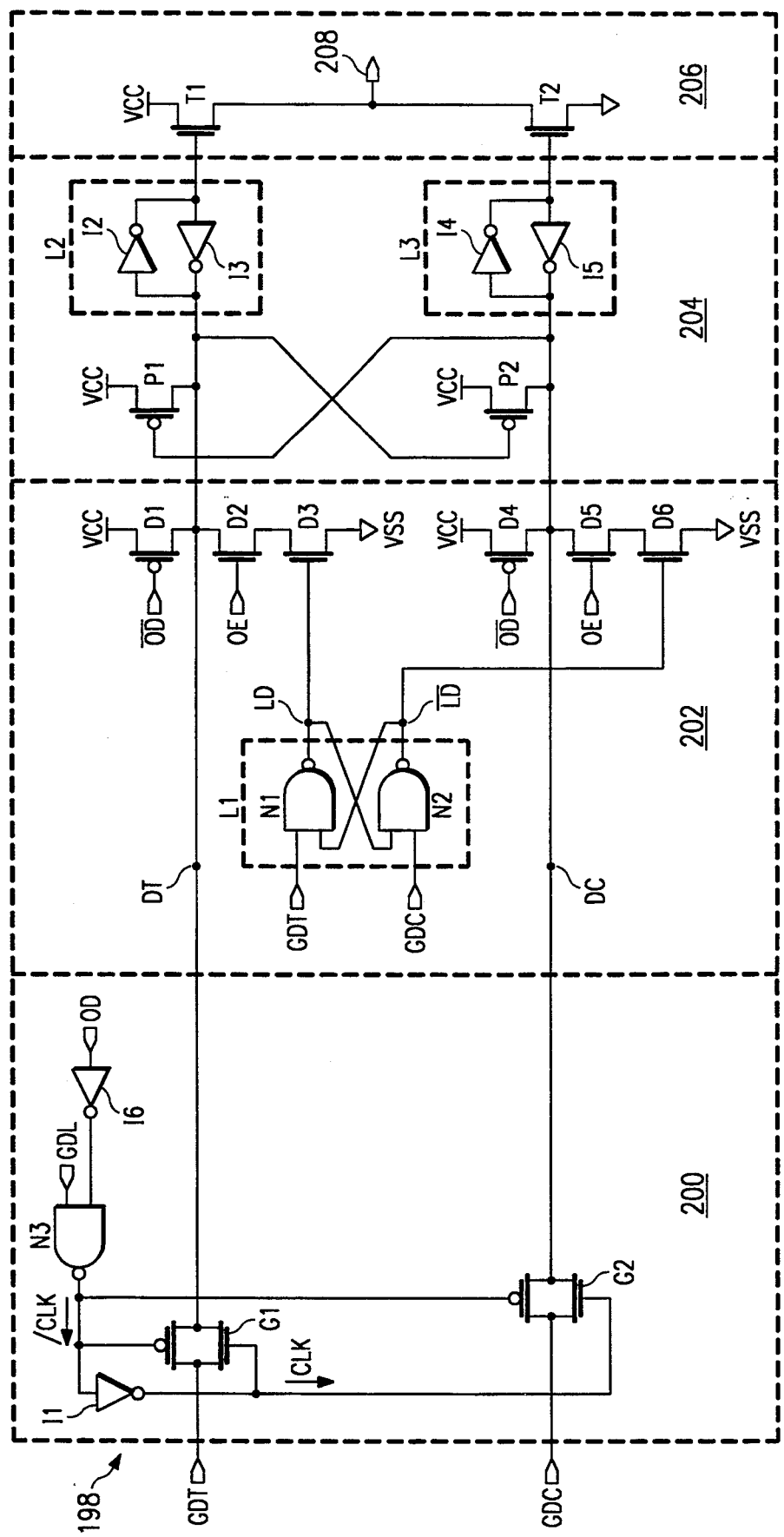
FIG. 3 is a schematic diagram of a latch controlled output driver including an enable/disable function according to the present invention.

Referring now to FIG. 3, a schematic diagram of a latch controlled output driver including an enable/disable function is illustrated in accordance with a preferred embodiment of the present invention. Latch controlled output driver 198 contains input circuit 200, enable/disable circuit 202, latch circuit 204, and output driver circuit 206. Input circuit 200 includes pass gates G1 and G2, inverters I1 and I6, and NAND gate N3. Pass gates G1 and G2 pass data from input points GDT and GDC in input circuit 200 to the rest of the circuits. Typically, input points GDT and GDC are connected to buses that are precharged high between clock cycles generated by the clock signal. Afterward, one of the input points, GDT or GDC, goes low when data is read.

Pass gates G1 and G2 are controlled by CLK and/CLK signals originating from NAND gate N3 and inverter I1. The clock signal is generated by a signal applied to input GDL. Pass gates G1 and G2 may be disabled by a disable signal (a logic one) being applied to point OD and traveling through inverter I6 into NAND gate N3.

Enable/disable circuit 202 includes an SR latch L1 formed by NAND gates N1 and N2. SR latch L1 stores data input at input points GDT and GDC. For example, if GDT is a logic one and GDC is a logic zero, point LD is a logic zero and point /LD is a logic one in SR latch L1. Enable/disable circuit 204 also contains transistors D1-D6. Transistors D1 and D4 are p-channel MOSFETs, while transistors D2, D3, D5, and D6 are n-channel MOSFETs. Transistors D1 and D4 have sources connected to power supply voltage VCC, while transistors D3 and D6 have sources connected to power supply voltage VSS. Transistors D1-D3 are connected in series and transistors D4-D6 also are connected in series. The gates of transistors D1 and D4 are controlled by a complementary disable signal being applied to point /OD, while the gates of transistors D2 and D5 are controlled by signals applied to points OE. Finally, the gates of transistors D3 and D6 are controlled by the output of SR latch L1 formed by NAND gates N1 and N2. NAND gate N1 produces a signal LD, while NAND gate N2 produces a signal /LD.

Latch circuit 204 includes latches L2 and L3 formed by cross-coupled inverters I2 and I3, and I4 and I5. Transistors P1 and P2 are p-channel MOSFETs employed to provide stability to latch controlled output driver circuit driver 198.

Output driver circuit 206 includes transistors T1 and T2. Transistor T1 is a pull-up transistor, while transistor T2 is a pull-down transistor. The signals applied to input points GDT and GDC result in an output signal at output point 208 when latch controlled output circuit 198 is enabled. When the signal at points OD is a logic one and the signal at point /OD is a logic zero, output point 208 is disabled. This disable signal (a logic one for point OD and a logic zero for point /OD) causes pass gates G1 and G2 to be disabled regardless of the signal at point GDL. Additionally, transistors D1 and D4 are turned on, which pulls points DT and DC high regardless of the signal generated by latches L2 and L3. This situation places output point 208 into an open state, also called a "Hi-Z state". Inverters I3 and I5 are weak in accordance with a preferred embodiment of the present invention. Thus, the state of points DT and DC are easily changed in response to transistors D1-D6.

Figure 4:
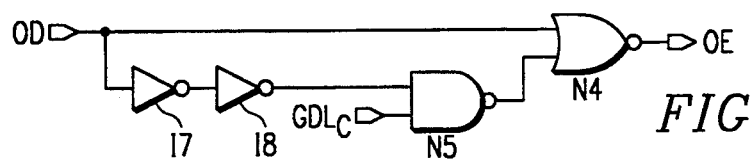
FIG. 4 is a schematic diagram of a circuit for providing an end of disable pulse.

Referring now to FIG. 4, a schematic diagram of a circuit for providing an end of disable pulse (EOD) is depicted. The circuit includes a NOR gate N4 that has an input connected to the output of a NAND gate N5. The other input of NOR gate N4 is connected point OD. NAND gate N5 has an input for $GDL_c$, which prevents an EOD pulse from being generated when point $GDL_c$ is a logic zero. The signal applied to point $GDL_c$ is always the complement of the signal applied to point GDL. Also, when data is passed through pass gates G1 and G2, (GDL is high and $GDL_c$ is low) an EOD pulse cannot be generated. NAND gate N5 also has an input connected to a series of inverters I7 and I8. This circuit provides a high going pulse at output EOD when point OD goes to a logic zero. Inverters I1 and I7 provide delays to set the width of the EOD pulse generated at output OE. Different numbers or inverters or different types of inverters may be employed to alter the width or duration of the EOD pulse.

A logic zero signal is applied to point OD and a logic one signal is applied to points/OD to enable latch controlled output driver circuit 198. As a result of these signals, transistors D1 and D4 are turned off and a EOD pulse is generated (if $GDL_c$ is high) to restore the latch state stored in latch L1 to latches L2 and L3 in latch circuit 204. Such a restoration of the latch state to latches L2 and L3 may be necessary because by this time points GDC and GDT may have been precharged high, eliminating the previous data. This situation is possible because the signal at point OD is asynchronous to the signal at GDL (clock signal). The EOD pulse is applied to points OE, which control transistors D2 and D5. When these two transistors, D2 and D5, are turned on, points DT and DC are restored to the states stored in SR latch L1.

For example, if the signal at point LD is a logic zero and the signal at point /LD is a logic one, the state of latch L1 causes transistor D3 to stay off in response to signal at point, LD leaving point DT at a logic one. Similarly, transistor D6 is turned on pulling point DC down to a logic zero. As a result, the data originally input at points GDT and GDC (a logic one and a logic zero) are returned to their original states in latches L2 and L3. When latch controlled output driver circuit 198 is enabled, the signal at point OD is a logic zero and the signal at point /OD is a logic one. A logic one at point /OD results in transistors D1 and D6 being turned off so that the restored data is not changed.

After the EOD pulse terminates, transistors D2 and D5 are turned off, however, the data already has been restored from SR latch L1 to latches L2 and L3. When $GDL_c$ is a logic zero, the EOD pulse is eliminated so that data from latch L1 at output point 208 is not written at points DT and DC. $GDL_c$ is set equal to zero when the pass gates are being turned on. This avoids conflict with incoming new data at points GDC and GDT. The EOD pulse is eliminated so that data stored in SR latch L1 is not output at output point 208 and allows for the incoming new data to be output at output point 208.

When the latch controlled output driver circuit 198 is disabled, the signal at point OD is a logic one, and the signal at point/OD is a logic zero. As a result, pass gates G1 and G2 are turned off and transistors D1 and D4 are turned on pulling both points DT and DC high causing an open or Hi-Z state at output point 208. In addition, transistors D2 and D5 are turned off, preventing any change in points DT and DC by transistors D3 and D6.

As a result of the Hi-Z state at output point 208, other logic devices may drive the line to which output point 208 is connected.

Figure 5:
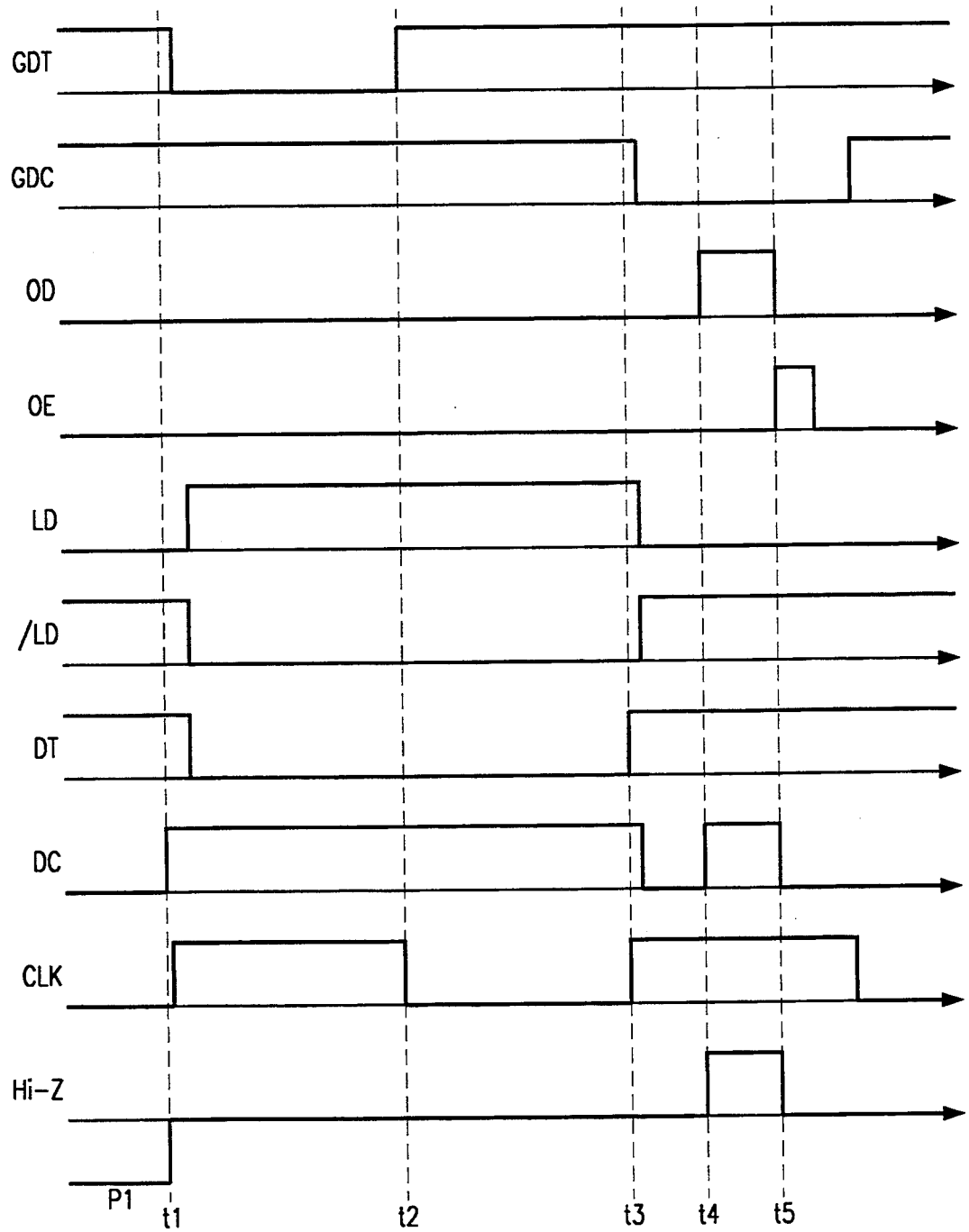
FIG. 5 is a timing chart of various input and output conditions.

Next, FIG. 5 is a timing chart of various input an output conditions for a latch controlled output driver 5 according to the present invention. GDT and GDC are precharged during time p1. Then, at time t1, GDT drops to a logic zero while GDC remains high, a logic one. In addition, the CLK signal at point GDL turns on or opens pass gates G1 and G2 setting points DT and DC, which in turn sets the states of latches L2 and L3 to a logic zero and a logic one respectively. As can be seen, latch L1 stores data from GDT and GDC as complement signals as seen at points LD and /LD. Subsequently, at time, t2, points GDT and GDC are again precharged high. Points DT and DC remain a logic zero and logic one. At time t3, GDT remains a logic one, and GDC drops to a logic zero. The CLK signal activates pass gates G1 and G2 and sets points DT and DC to a logic one and a logic zero, setting latch L2 to a logic one and latch L3 to a logic zero.

Thereafter, at time t4, a disable signal is sent to the latch controlled output driver circuit 198 at point OD, disabling latches L2 and L3. Point DC is pulled up to a logic one causing the output point 208 to have a Hi-Z impedance as can be seen by the graph of Hi-Z in FIG. 5. Then, at time t5, the disable signal at OD is ended and a EOD signal is generated at points OE, resulting in the data stored in the latch L1 being restored to latch L2 and L3 as can be seen by points DT and DC being restored to a logic one and a logic zero respectively.

Consequently, according to the present invention, the latch controlled output driver circuit 198 may be efficiently enabled and disabled since additional logic gates between latch circuit 204 and output driver circuit 206 may be eliminated. Latches L1 and L2 may be restored to the previous data states using the present invention upon reenabling the latch controlled output driver. Additionally, the elimination of the NAND gates shown in the prior art provide a faster response in latch controlled driver circuit 198. Employing the present latch controlled driver circuit in a memory can speed up the response of the memory and other circuits requiring latch controlled output driver circuits. Although the present invention is depicted using MOS technology, other types of technology and transistors may be used in accordance with a preferred embodiment of the present invention.

Although the depicted embodiment shows only two latches connected to the output driver, additional latches may be connected to the output driver and selected using a multiplexing circuit in accordance with a preferred embodiment of the present invention. Other variations to the latches and inverters may be made by those of ordinary skill in the art. For example, inverter I3 in latch L2 and inverter I5 in latch L3 may be replaced with NAND gates instead, with the other input being from point Dc for the NAND gate replacing inverter I3 and from point Dt for the NAND gate replacing inverter I5.

The depicted embodiment shows the use of pass gates for gating or sending information into the latches. Other types of gates or devices known to those skilled the art for gating or providing an interface circuit for controlling data reaching the latches may be used according to the present invention.

While the invention has been particularly shown and described with reference to a preferred embodiment, it will be understood by those skilled in the art that various changes in form and detail may be made therein without departing from the spirit and scope of the invention.

What is claimed is:

1. A latch controlled output driver comprising:
   an output driver circuit including a pull-up transistor and a pull-down transistor connected in series, wherein the pull-up transistor has a first source/drain connected to a first power supply voltage and a second source/drain connected to a first source/drain of the pull-down transistor and the pull-down transistor has a second source/drain connected to a second power supply voltage;
   an output point located between the pull-up and pull-down transistors;
   a first latch circuit having an input and an output, wherein the output of the first latch circuit is connected to a gate of the pull-up transistor;
   a second latch circuit having an input and an output, wherein the output of the second latch circuit is connected to a gate of the pull-down transistor;
   a control circuit connected to the first and second latches, wherein the control circuit may selectively set the first and second latches to first and second preselected states in response to a control signal applied to the control circuit, wherein the pull-up and pull-down transistors are turned off by the first and second latches in the first and second preselected states, wherein the output point is placed into an open state, disabling the latch controlled output driver.

2. The latch controlled output driver of claim 1, further comprising:
   a data circuit connected to the first and second latch circuits, wherein the data circuit stores data and sends the data to the first and second latches when the latch controlled output driver is enabled after being disabled.

3. The latch controlled output driver of claim 1, wherein the control circuit comprises:
   a first disable circuit connected to the first latch, wherein the first latch may be set to a first preselected state by the first disable circuit; and
   a second disable circuit connected to the second latch, wherein the second latch may be set to a second preselected state by second disable circuit.

4. The latch controlled output driver of claim 3, wherein the first and second disable circuits each comprises three transistors connected in series;
   a first transistor having a first source/drain connected to the first power supply voltage and a second source/drain connected to input of a latch, wherein the first transistor is turned on and off by a signal and wherein the latch controlled output driver is disabled when the first transistor is turned on and the latch controlled output driver is enabled when the first transistor is turned off;
   a second transistor having a first source/drain connected to the input of a latch, wherein the second transistor is turned on and off a second signal; and
   a third transistor having a first source/drain connected to a second source/drain of the second transistor and a second source/drain connected to the second power supply voltage, wherein the third transistor is controlled by a data signal.

5. The latch controlled output driver of claim 4, further comprising:

a data circuit connected to a gate of the third transistor in the first and second latches, wherein the data circuit stores data and sends the data to the first and second latches when the latch controller output driver is enabled after being disabled and the second transistor in each of the disable circuits is turned on.

6. The latch controlled output driver of claim 5, wherein the data circuit selectively turns on the third transistors in the disable circuits to restore the state of the first and second latches.

7. The latch controlled output driver of claim 6, wherein the second signal is a pulse that turns on the second transistor in the disable circuits for a selected period of time, wherein the state of the first and second latches are restored during the selected period of time.

8. The latch controlled output driver of claim 7, wherein the selected period of time begins after the latch controlled output driver is enabled after being disabled.

9. The latch controlled output driver of claim 8, further comprising a first gate having an output connected to the input of the first latch and a second gate having an output connected to the input of the second latch, wherein the first and second gates send data to the first and second latches, wherein the pulse is generated only if first and second gates are turned off.

10. The latch controlled output driver of claim 6, further comprising:
- a NOR gate having an output, a first input, and a second input, the output being connected to the gates of the second transistors in the first and second latches;
- an inverter having an input and an output;
- a NAND gate having an output, a first input, and a second input, the output being connected to the first input of the NOR gate and the first input being connected to an output of an inverter; and
- a connection point connected to the second input of the NOR gate and the input of the inverter, wherein the output of the NOR gate generates a pulse in response to a logic one applied to the second input of the NAND gate and a logic zero applied to the connection point.

11. The latch controlled output driver of claim 4, wherein the first transistor is a p-channel field effect transistor, and the second and third transistors are n-channel field effect transistors.

12. The latch controlled output driver of claim 1, wherein the pull-up and pull-down transistors are n-channel field effect transistors.

13. The latch controlled output driver of claim 1, wherein the pull-up transistor is a p-channel field effect transistors and the pull-down transistor is an n-channel field effect transistor.

14. The latch controlled output driver of claim 1, wherein the first power supply voltage is an upper power supply voltage and the second power supply voltage is a lower power supply voltage.

15. A latch controlled output driver comprising:
- an output driver circuit including a pull-up transistor and a pull-down transistor connected in series, wherein the pull-up transistor has a drain connected to a first power supply voltage and a source connected to a drain of the pull-down transistor and the pull-down transistor has a source connected to a second power supply voltage;
- an output connection located between the pull-up and pull-down transistors;
- a first latch circuit having an input and an output, wherein the output of the first latch circuit is connected to a gate of the pull-up transistor;
- a second latch circuit having an input and an output, wherein the output of the second latch circuit is connected to a gate of the pull-down transistor;
- a first gate having an output connected to the input of the first latch circuit;
- a second gate having an output connected to the input of the second latch circuit;
- first and second disable circuits, the first disable circuit being connected to the input of the first latch and the second disable circuit being connected to the input of the second latch, wherein the first and second latches may be set to preselected states such that the pull-up and pull-down transistors are turned off, wherein the latch controlled output driver is disabled; and
- a data circuit connected to the first and second latches, wherein the data circuit stores data and sends the data to the first and second latches when the latch controlled output driver is enabled after being disabled.

16. The latch controlled output driver of claim 15, wherein the data circuit includes:
- a first enable transistor having a first source/drain connected to the input of the first latch and a gate controlled by an enable signal, wherein the transistor is turned on by the enable signal;
- a second enable transistor having a first source/drain connected to the input of the second latch and a gate controlled by an enable signal, wherein the transistor is turned on by the enable signal;
- a first data transistor having a first source/drain connected to a second source/drain of the first enable transistor, a second source/drain connected to the second power supply voltage; and
- a second data transistor having a first source/drain connected to a second source/drain of the second enable transistor, a second source/drain connected to the second power supply voltage.

17. The latch controlled output driver of claim 15, wherein the first and second gates are disabled when the latch controlled output driver is disabled.

18. The latch controlled output driver of claim 15, wherein the pull-up and pull-down transistors are n-channel field effect transistors.

19. The latch controlled output driver of claim 15, wherein the pull-up transistor is a p-channel field effect transistors and the pull-down transistor is an n-channel field effect transistor.

20. The latch controlled output driver of claim 15, wherein the first power supply voltage is an upper power supply voltage and the second power supply voltage is a lower power supply voltage.

21. The latch controlled output driver of claim 15, wherein the first and second gates are pass gates.

22. A latch controlled output driver comprising:
- an output driver circuit including a pull-up transistor and a pull-down transistor, wherein the pull-up transistor has a drain connected to an upper power supply voltage and a source connected to a drain of the pull-down transistor and the pull-down transistor has a source connected to a lower power supply voltage;

an output connection located between the pull-up and pull-down transistors;

a first latch circuit having an input and an output, wherein the output of the first latch circuit is connected to a gate of the pull-up transistor;

a second latch circuit having an input and an output, wherein the output of the second latch circuit is connected to a gate of the pull-down transistor;

a first gate having an output connected to the input of the first latch circuit;

a second gate having an output connected to the input of the second latch circuit;

a first disable transistor having a first source/drain connected to the input of the first latch, a second source/drain connected to the upper power supply voltage, and a gate controlled by a disable signal, wherein said first transistor is turned on by the disable signal;

a second disable transistor having a first source/drain connected to the input of the second latch, a second source/drain connected to the upper power supply voltage, and a gate controlled by a disable signal, wherein said first transistor is turned on by the disable signal;

a first enable transistor having a first source/drain connected to the input of the first latch and a gate controlled by an enable signal, wherein the transistor is turned on by the enable signal;

a second enable transistor having a first source/drain connected to the input of the second latch and a gate controlled by an enable signal, wherein the transistor is turned on by the enable signal;

a first data transistor having a first source/drain connected to a second source/drain of the first enable transistor, a second source/drain connected to the lower power supply voltage;

a second data transistor having a first source/drain connected to a second source/drain of the second enable transistor, a second source/drain connected to the lower power supply voltage;

the latch controlled output driver being disabled when the first and second disabled transistors are turned on and the first and second enable transistors are turned off, wherein the pull-up and pull-down transistors are turned off placing the output connection in an open state disabling the latch controlled output driver; and the latch controlled output driver being enabled when the first and second disabled transistors are turned off and the first and second enable transistors are turned on, wherein the first and second data transistors provide data to the first and second latches enabling the latch controlled output driver.

23. The latch controlled output driver of claim 22, further comprising a data circuit connected to the gates of the first data and second data transistors, wherein the data circuit stores a state of the first and second latches present when the latch controlled output driver is enabled and restores the state of the first and second latches when the latch controlled output driver is enabled after being disabled and the second transistor in the first and second latches is turned on.

24. The latch controlled output driver of claim 23, wherein the data circuit includes a first NAND gate and a second NAND gate, the first NAND gate having a first input connected to a true data line and a second input connected to an output of the second NAND gate, the second NAND gate having a first input connected to a complement data line and a second input connected to an output of the first NAND gate, wherein the output of the first NAND gate is connected to the gate of the first data transistor and the output of the second NAND gate is connected to the gate of the second data transistor.

25. The latch controlled output driver of claim 22, wherein the pull-up and pull-down transistors are n-channel field effect transistors.

26. The latch controlled output driver of claim 22, wherein the pull-up transistor is a p-channel field effect transistors and the pull-down transistor is an n-channel field effect transistor.

* * * * *